United States Patent
Biber

(10) Patent No.: US 10,359,484 B2
(45) Date of Patent: Jul. 23, 2019

(54) SHEATH CURRENT FILTER WITH INTEGRATED OPTICAL CABLE GUIDE

(71) Applicant: Stephan Biber, Erlangen (DE)

(72) Inventor: Stephan Biber, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 703 days.

(21) Appl. No.: 14/797,358

(22) Filed: Jul. 13, 2015

(65) Prior Publication Data

US 2016/0011286 A1 Jan. 14, 2016

(30) Foreign Application Priority Data

Jul. 14, 2014 (DE) .................. 10 2014 213 643

(51) Int. Cl.
*G01R 33/36* (2006.01)
*G01R 33/341* (2006.01)
*G01R 33/422* (2006.01)
*G01R 33/3415* (2006.01)

(52) U.S. Cl.
CPC ........ *G01R 33/3685* (2013.01); *G01R 33/341* (2013.01); *G01R 33/3415* (2013.01)

(58) Field of Classification Search
CPC ............ G01R 33/3415; G01R 33/3852; G01R 33/341
See application file for complete search history.

(56) References Cited

U.S. PATENT DOCUMENTS

| 2,966,640 | A | | 12/1960 | Eiland et al. | |
|---|---|---|---|---|---|
| 4,298,245 | A | * | 11/1981 | Aulich | .................. G01R 15/24 250/227.17 |
| 6,593,744 | B2 | | 7/2003 | Burl et al. | |
| 2008/0164879 | A1 | * | 7/2008 | Bollenbeck | ........ G01R 33/3621 324/322 |
| 2010/0022868 | A1 | * | 1/2010 | Kocaturk | ............. G01R 33/287 600/411 |
| 2011/0234229 | A1 | * | 9/2011 | Biber | ................. G01R 33/3685 324/322 |
| 2012/0187950 | A1 | | 7/2012 | Biber et al. | |
| 2013/0181716 | A1 | | 7/2013 | Greim | |

FOREIGN PATENT DOCUMENTS

| CN | 102200570 A | 9/2011 |
|---|---|---|
| CN | 102890253 A | 1/2013 |
| DE | 102010012393 A1 | 9/2011 |

(Continued)

OTHER PUBLICATIONS

C. M. Hillenbrand et al.: The Bazooka Coil: A Novel Dual-Purpose Device for Active Visualization and Reduction of Cable Currents in Electrically Conductive Endovascular Instruments, Proc. Intl. Soc. Mag. Reson. Med. 13, p. 197; 2005.

(Continued)

*Primary Examiner* — Patrick Assouad
*Assistant Examiner* — Haidong Zhang
(74) *Attorney, Agent, or Firm* — Lempia Summerfield Katz LLC

(57) ABSTRACT

A sheath current for an imaging magnetic resonance tomography system is provided, wherein a coil element of the sheath current filter is embodied to surround a waveguide of the sheath current filter, a local coil connection, and a local coil.

20 Claims, 7 Drawing Sheets

(56) References Cited

FOREIGN PATENT DOCUMENTS

| | | |
|---|---|---|
| DE | 102010031933 A1 | 1/2012 |
| DE | 102011079596 A1 | 1/2013 |
| JP | 2004141412 A | 5/2004 |
| JP | 2012050507 A | 3/2012 |

OTHER PUBLICATIONS

German Office Action for related German Application No. 10 2014 213 643 .1, dated Jun. 17, 2015, with English Translation.
Chinese Office Action for related Chinese Application No. 201510412276.5 dated Nov. 3, 2017, with English translation.

* cited by examiner

SHEATH CURRENT FILTER WITH INTEGRATED OPTICAL CABLE GUIDE

CROSS-REFERENCE TO RELATED APPLICATIONS

This application claims the benefit of DE 10 2014 213 643.1, filed on Jul. 14, 2014, which is hereby incorporated by reference in its entirety.

TECHNICAL FIELD

The embodiments relate to sheath current filters, local coil connection cables, and local coils.

BACKGROUND

A magnetic resonance tomograph (MRT) for examining objects or patients by magnetic resonance tomography is described in U.S. Pat. No. 2,966,640 A, "The Bazooka Coil: A Novel Dual-Purpose Device for Active Visualization and Reduction of Cable Currents in Electrically-Conductive Endovascular Instruments" ISMRM, DE 10 2010 031 933 A1, and DE 10 2010 012 393 A1.

SUMMARY

The scope of the present invention is defined solely by the appended claims and is not affected to any degree by the statements within this summary. The present embodiments may obviate one or more of the drawbacks or limitations in the related art.

The object of the present embodiments is to optimize a sheath current filter for a MRT.

BRIEF DESCRIPTION OF THE DRAWINGS

FIG. 4 depicts an example of a simplified diagram of sections of two local coil connection cables with three coil elements at the top or one in the middle and a capacitive element able to be contacted on the coil element by soldering it on or pressing it on.

DETAILED DESCRIPTION

Figure 10:
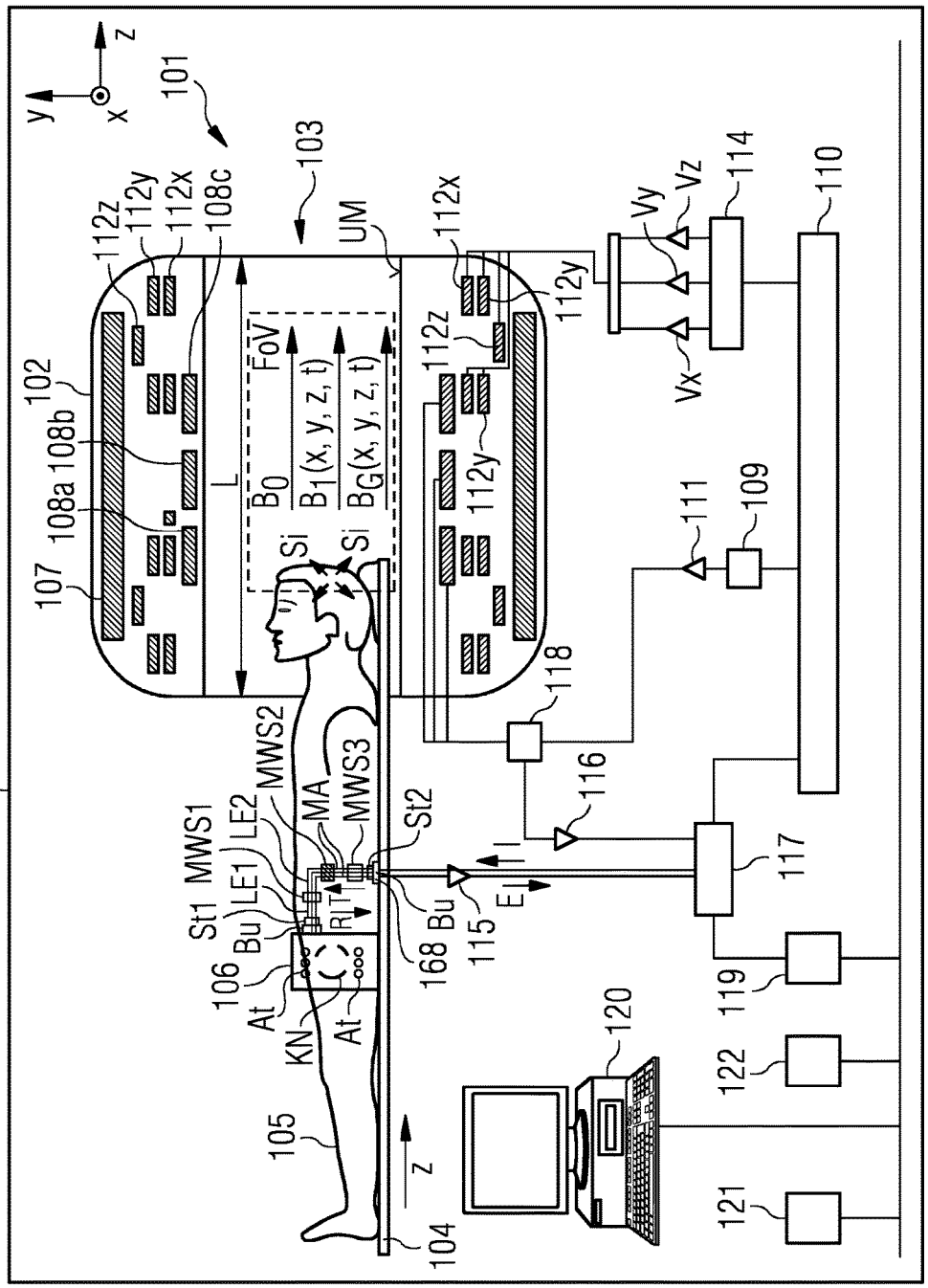
FIG. 10 depicts an example of a schematic of a MRT system.

FIG. 10 depicts an imaging magnetic resonance device MRT 101 (contained in a shielded room or Faraday cage F) including a hollow cylinder 102 having an in this case tubular bore 103 into which a patient couch 104 bearing a body 105 (e.g. of an examination object or a patient) (with or without local coil arrangement 106) may be introduced in the direction of the arrow z so that images of the patient 105 may be generated by an imaging method. Disposed on the patient here is a local coil arrangement 106 that may be used in a local region (also referred to as field of view or FoV) of the MRT to generate images of a subregion of the body 105 in the FOV. Signals of the local coil arrangement 106 may be evaluated (e.g. converted into images, stored or displayed) by an evaluation device (168, 115, 117, 119, 120, 121, etc.) of the MRT 101 that may be connected to the local coil arrangement 106, e.g., via coaxial cable or wirelessly (167), etc.

When a magnetic resonance device MRT 101 is used in order to examine a body 105 (e.g., an examination object or a patient) by magnetic resonance imaging, different magnetic fields that are coordinated with one another with the utmost precision in terms of their temporal and spatial characteristics are radiated onto the body 105. A strong magnet (e.g., a cryomagnet 107) in a measurement chamber having an in this case tunnel-shaped bore 103 generates a strong static main magnetic field $B_0$ ranging, e.g., from 0.2 Tesla to 3 Tesla or more. A body 105 that is to be examined, supported on a patient couch 104, is moved into a region of the main magnetic field $B_0$ that is approximately homogeneous in the area of observation FoV. The nuclear spins of atomic nuclei of the body 105 are excited by way of magnetic radio-frequency excitation pulses $B_1$ (x, y, z, t) HF, RF that are emitted via a radio-frequency antenna (and/or a local coil arrangement, if necessary) that is depicted here in simplified form as a body coil 108 (e.g., multipart=108a, 108b, 108c). Radio-frequency excitation pulses (also known as HF or RF) are generated, e.g., by a pulse generation unit 109 that is controlled by a pulse sequence control unit 110. Following amplification by a radio-frequency amplifier 111, the pulses are directed to the radio-frequency antenna 108. The radio-frequency system depicted here is indicated only schematically. More than one pulse generation unit 109, more than one radio-frequency amplifier 111, and a plurality of radio-frequency antennas 108a, b, c may be used in a magnetic resonance device 101.

The magnetic resonance device 101 also has gradient coils 112x, 112y, 112z by which magnetic gradient fields $B_G$ (x, y, z, t) are radiated in the course of a measurement in order to provoke selective layer excitation and for spatial encoding of the measurement signal. The gradient coils 112x, 112y, 112z are controlled by a gradient coil control unit 114 (and if appropriate by way of amplifiers Vx, Vy, Vz) that, like the pulse generation unit 109, is connected to the pulse sequence control unit 110.

Signals emitted by the excited nuclear spins (e.g., of the atomic nuclei in the examination object) are received by the body coil 108a, b, c and/or at least one local coil arrangement 106, amplified by assigned radio-frequency preamplifiers 116, and further processed and digitized by a receive unit 117. The recorded measurement data is digitized and stored in the form of complex numeric values in a k-space matrix. A multidimensional Fourier transform may be used to reconstruct an associated MR image from the value-populated k-space matrix.

For a coil, which may be operated in both transmit and receive mode, (e.g., the body coil 108 or a local coil 106), correct signal forwarding is regulated by an upstream duplexer 118.

From the measurement data, an image processing unit 119 generates an image that is displayed to a user via an operator console 120 and/or stored in a memory unit 121. A central computer unit 122 controls the individual system components.

FIG. 1-9 depict examples of sheath current filters MWS1, MWS2, MWS3, local coil connection cables LAK and local coils 106.

Figure 8:
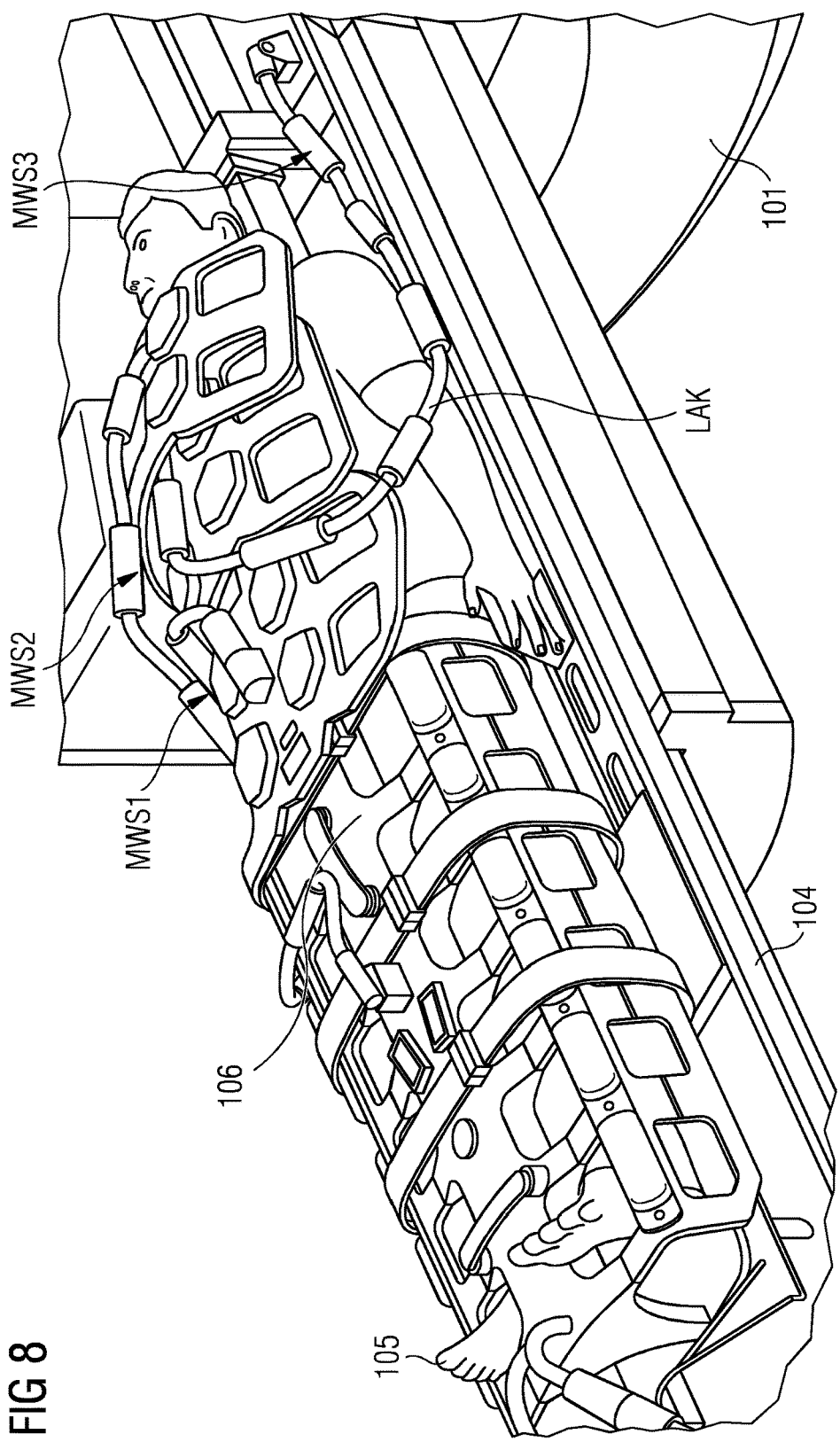
FIG. 8 depicts an example of a local coil with sheath current filters on a patient.
Figure 9:
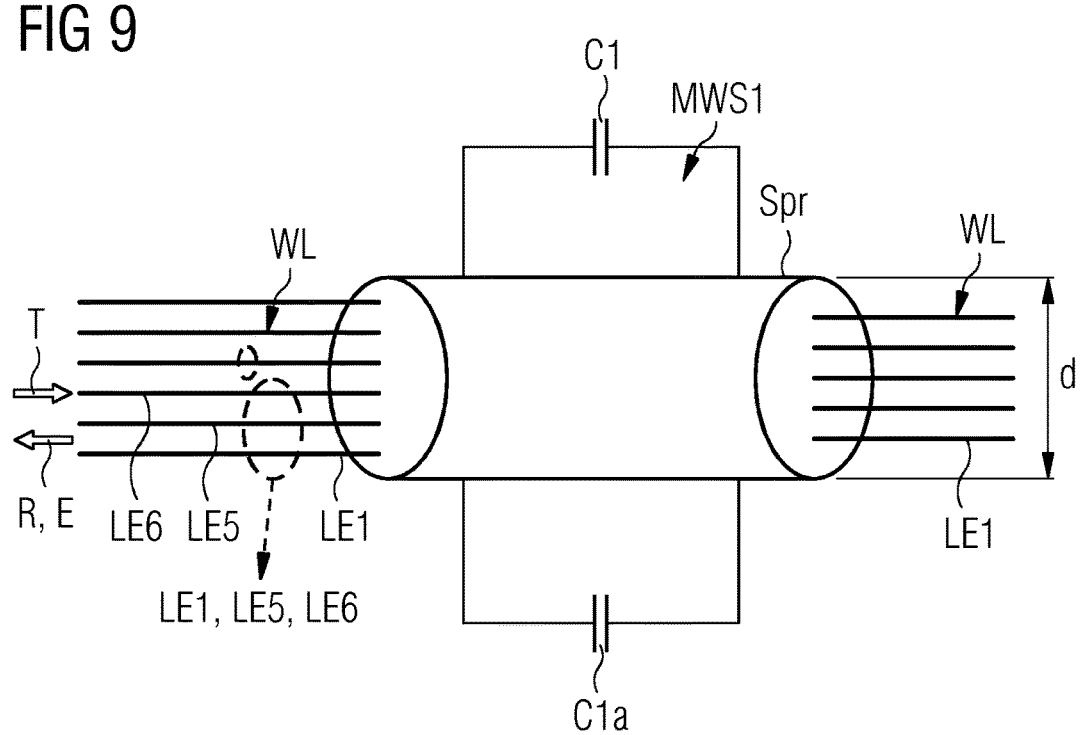
FIG. 9 depicts an example of a bazooka sheath current filter.

In MR tomography, images with high signal-to-noise ratio (S/N) are acquired with so-called local coils 106 (e.g., loops) as in, e.g., FIGS. 8 and 9.

Figure 7:
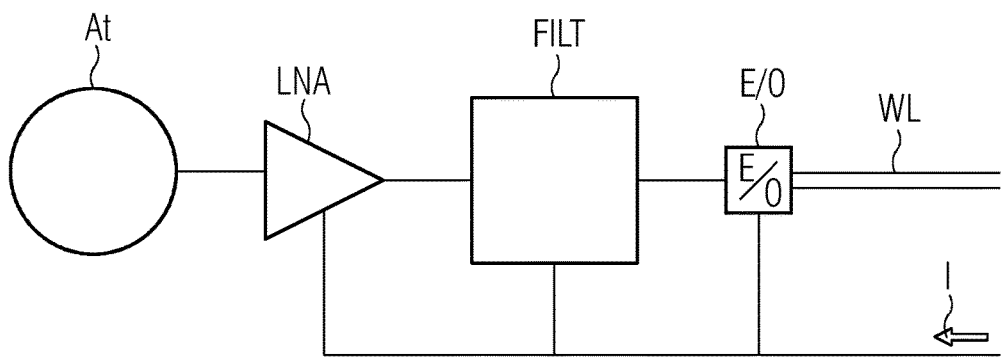
FIG. 7 depicts an example of a simplified diagram of a few elements of a local coil.

In such cases, excited nuclei induce a voltage in antennas At in the local coil 106, which is amplified in accordance with FIG. 7 with a low noise preamplifier LNA, if necessary filtered with a filter (FILT), converted electro-optically with an electro-optical converter E/O, and forwarded via a cable at the MR frequency (or here via a waveguide WL) to the receiver electronics (117, 110) of a MRT (101) in accordance with FIG. 9.

To improve the signal-to-noise ratio even with high-resolution images so-called high field systems are used. The basic field strengths currently lie at, e.g., three Tesla and higher. Since more coil elements (e.g., loops or antennas) At may also be connected to a MR receive system than there are receivers present, a switching matrix (called RCCS here) is built between receiver antennas and receivers. This routes the currently active receive channels to the available receivers. This makes it possible to connect more coil elements At than there are receivers present, since for a full body coverage only the coils At have to be read out that are located in the FoV (Field of View) or in the homogeneity volume of the magnet 102 of the MRT 101.

The individual antenna elements At are also referred to as coil elements below.

A local coil 106 may be referred to for example as an arrangement that has one or (in an array coil) a number of coil elements At. A local coil 106 contains, e.g., coil elements At, a preamplifier LNA, further electronics FILT, cabling, a housing, and mostly a local coil connection cable LAK (K1, K2, WL) with at least one connector St1, St2 at one or both ends of the local connection cable (LKA, e.g. with WL, W1, W2), through which it is connected (via an interface such as socket BU etc.) to a MRT 101 or to an evaluation device 117 of a MRT 101.

A local coil 106 is located during MRT imaging in the transmit field (B1field) of a body coil 108 (108a, b, c). The body coil 108 is a large coil surrounding the body of a patient 105 that is used for exciting the spins in the body. The body coil 108 creates a circular or elliptical $B_1$ field. On the basis of the $B_1$ field $B_1$ (x, y, z, t) currents are induced on all conductors that are located in this field. On longer cables in particular this may result in resonance effects (e.g., cables act as antennas) through which high currents may flow on the outer sides of the cable sheath, which may result in the patient being endangered (e.g., heating). Long before the currents are so high that endangering the patient becomes relevant, the $B_1$-induced currents may cause secondary $B_1$ fields on the conductor structures of the LAK that destroy the $B_1$ homogeneity of the body coil transmit field.

A further problem may arise when a coaxial cable experiences a discontinuity (e.g. if it is soldered to a printed circuit board PCB, or the coaxial mode is departed from in another way). The preamplified receive signals may reach the outer side from the inner side of the sheath. If the cable is routed along close to an antenna At the preamplified signal may couple back again into the antenna At and this may result in self-oscillation of the local coil. The local coil 106 may not be used in this state for MRT imaging.

Possible problems are also as follows. (1) Sheath currents created by the transmitter may be a cause of Bihomogeneity problems and problems with impermissibly high patient heating (e.g., safety). (2) Sheath currents created by a receive signal R of a local coil 106 may lead, on coupling back into a receive (RX) antenna At of the local coil, to self-oscillation of the local coil.

Because of the relationship presented above, all line structures that are significantly longer than multiples of 10 cm are provided in high-field systems (e.g., 1.5 T-3 T) with sheath current filters MWS1, MWS2, MWS3. Sheath current filters MWS1, MWS2, MWS3 are resonant blocking circuits that suppress the flow of current. Since in existing MRT systems 101 the transmit frequency of the body coil 108 (108a,b,c) and the receive frequency of the local coils 106 as well as the signal that is transmitted from the local coils 106 on cables LAK (e.g. via connections in a patient couch) to the MRT-System 101, 117 may be identical, a solution to the layout of a sheath current filter as in FIG. 8, for example, is used in which the sheath current created by the TX field is suppressed only on the outside of the coax sheath but not however on its inside. A suppression on the inside may be unsuitable since otherwise the useful signal is also suppressed.

Other forms of sheath current filter (MWS), such as the so-called bazooka coil, although of a different geometrical design (e.g., not wound) also aim to only suppress the current on the outer side of the sheath and to let the current on the inner side flow unhindered at the MR frequency.

Problems of a solution known at least internally may be as follows. (1) MWS are currently only able to be wound manually and are therefore more expensive. (2) Because of the large diameter of the coax cable and its minimum bending radius, MWS need relatively large amounts of space, especially for the coax cable wound into an inductance (e.g., FIG. 1). (3) The space requirement in local coils may especially be a problem for coils that are to be mechanically flexible. (4) MWS of current designs are not simple to tune, since the inductance is defined by the number of windings of the coax inductance. Components are special parts manufactured manually as extra parts for MR use.

New opportunities arise to design the layout of a sheath current filter MWS1, MWS2, MWS3 in which a receive signal Si, E of a local coil 106 is still converted in the local coil 106 from electrical to optical with an electro-optical converter E/O, and the analog or previously digitized signal is coupled into a dielectric waveguide WL (e.g., glass fiber, polymer fiber).

This may be made possible when coax cables are dispensed with through the transmission of the receive signals on a dielectric waveguide WL (subsequently also called "fiber") and (e.g., if no wireless energy supply or battery solution is possible for the local coil 106) only power and/or possibly low-frequency (e.g., <20 kHz) switching signals SG is supplied. In addition, a new structure may be made possible by the fibers (unlike coax cables) being constructed from non-conductive materials (e.g., plastic, glass) and thus the internal space of a coil L1, L2 being able to be used for cable guidance without perceptible effects on the coil itself.

To reduce the size and to simplify the manufacturing, it is proposed for example to route a waveguide WL (e.g. one or more glass fibers) through the inductances (or coils) L1, L2 etc. of the remaining resonant circuits. If remaining electrical lines (e.g., power, switching signals) are necessary the supply line may be provided with sheath current filters MWS1, MWS2 etc. A mechanical integration of at least one sheath current filter MWS1, MWS2, MWS3 with a waveguide (or fiber) WL allows the space required for and possibly the costs of such sheath current filters to be significantly reduced. This enables local coil connection cables LAK to be realized less stiff, lighter and thus in a more user-friendly manner.

FIGS. 1-5 depict details of a few variants of the structure of sheath current filters MWS1-3 and local coil connection cables LAK.

Figure 1:
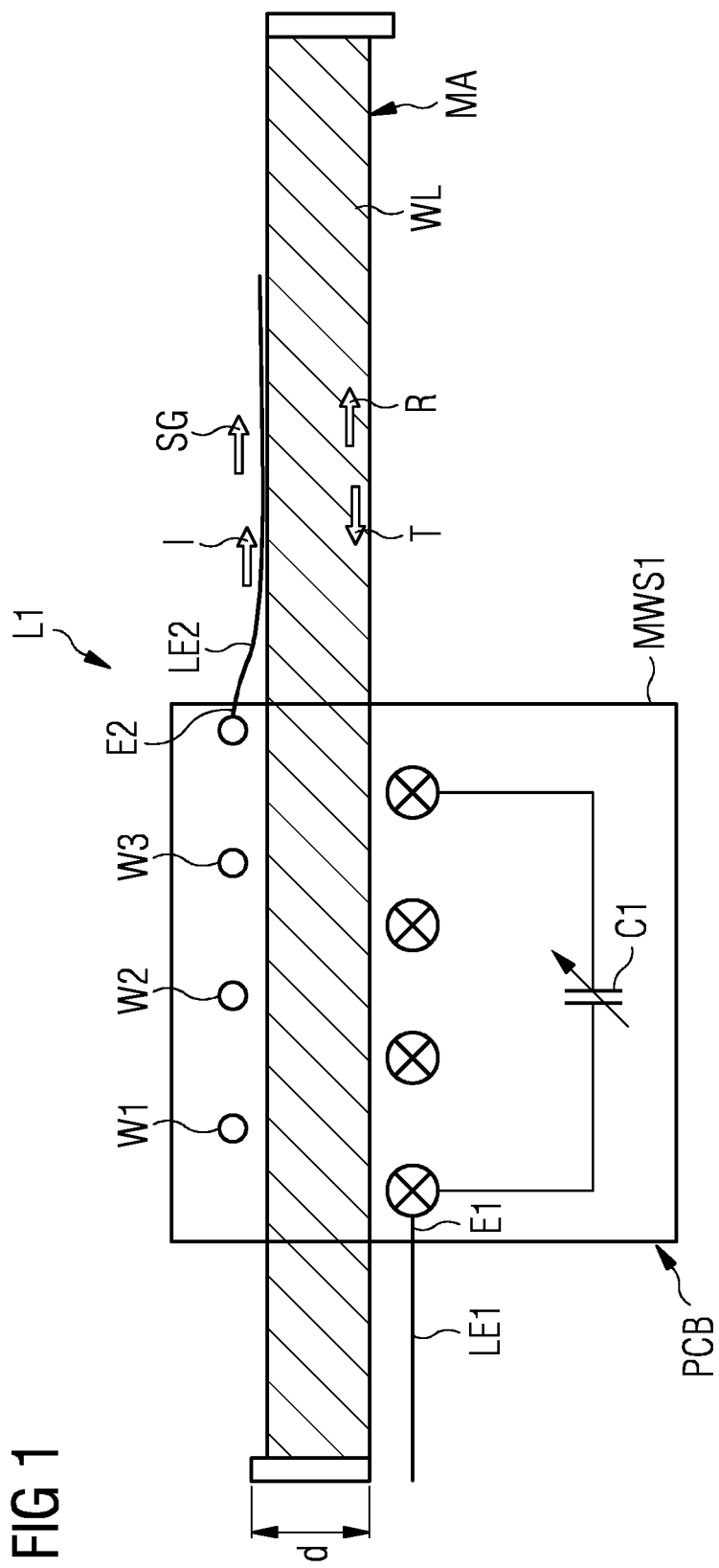
FIG. 1 depicts an example of a simplified cross-sectional diagram of a local coil connection cable with a sheath current filter pushed onto the cable.

In FIG. 1, a sheath current filter MWS1 is disposed on the surface of the sheath MA of a waveguide WL on which or on the sheath MA of which an electrically-conducting cable LE1, (W1, W2, W3), LE2 runs.

The sheath current filter MWS 1 in FIG. 1 is depicted here as a printed circuit board PCB with a hole of a diameter d (of, e.g., 0.2 to 3 mm, especially 1 mm-2 mm) therein to accommodate a waveguide WL routed therethrough (d), with a capacitive (e.g., fixed or adjustable) element C1, and with windings W1, W2, W3 (e.g., forming an inductive element L1) around the longitudinal axis of the waveguide WL. The reciprocal of (square root of (L1*C1*2*Pi)) may correspond to the Lamor frequency of the MRT 101.

Figure 3:
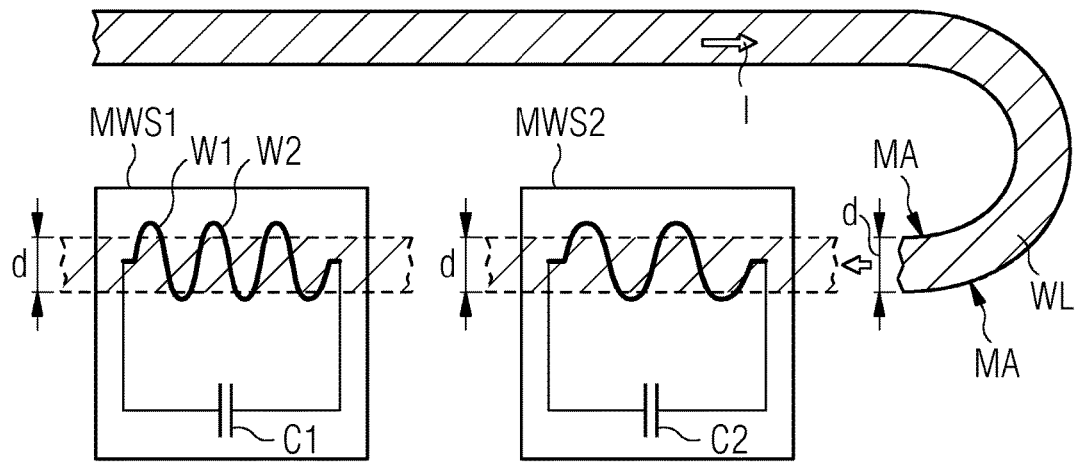
FIG. 3 depicts an example of a simplified cross-section of a local coil connection cable and sheath current filters able to be pushed onto the cable.

In accordance with FIG. 3, by one or more sheath current filters MWS1, MWS2 in accordance with FIG. 1, e.g., in the form of a printed circuit board PCB in each case with a hole of a diameter d, a waveguide WL may be routed through or pushed through in the direction of the arrow.

Figure 2:
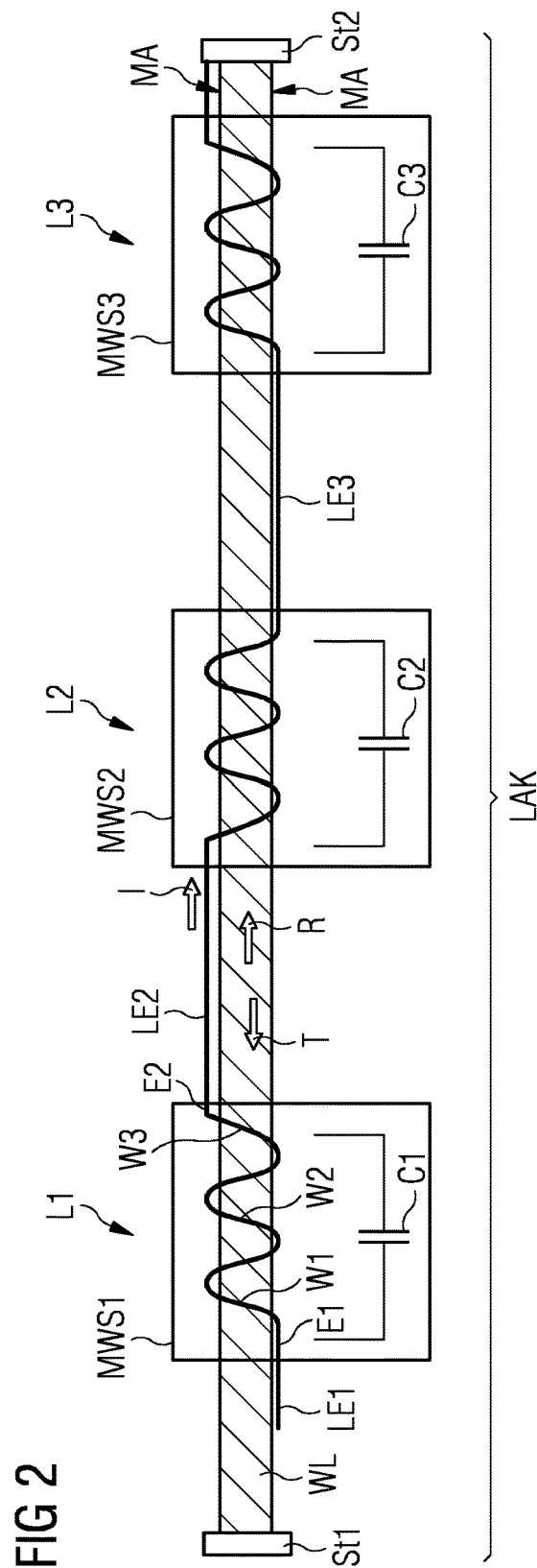
FIG. 2 depicts an example of a simplified cross-sectional diagram of a local coil connection cable with a number of sheath current filters disposed serially in relation to one another.

In FIG. 2, a number of sheath current filters MWS1, MWS2, MWS3 are connected serially to one another on a local coil connection cable LAK and are each disposed around the longitudinal axis of the waveguide WL and their inductive elements L1, L2, L3 (as well as connectors St1, St2 on the waveguide and cable ends) are connected to each other electrically-conductively by electrically-conducting cables LE1, LE2, LE3 etc.

It is also conceivable in accordance with FIG. 2 that at least one inductive element L1, L2 (unlike what is depicted in FIG. 1) will be or is directly wound with windings W1, W2, W3 on the sheath MA of a waveguide WL or a fiber. This would be a technically different version that may lead to another manufacturing technique since in this way the at least one inductive element L1, L2 would already be part of the waveguide WL (e.g., a fiber) or would be the sheath MA of the waveguide WL, around that a copper wire (for forming L1, L2, L3) is wound in a defined manner. This structure would then accordingly (e.g., by soldering on, pressing on etc.) be connected electrically with further circuits (C1, etc.), in order to create the resonance for suppressing the sheath currents.

Figure 4:
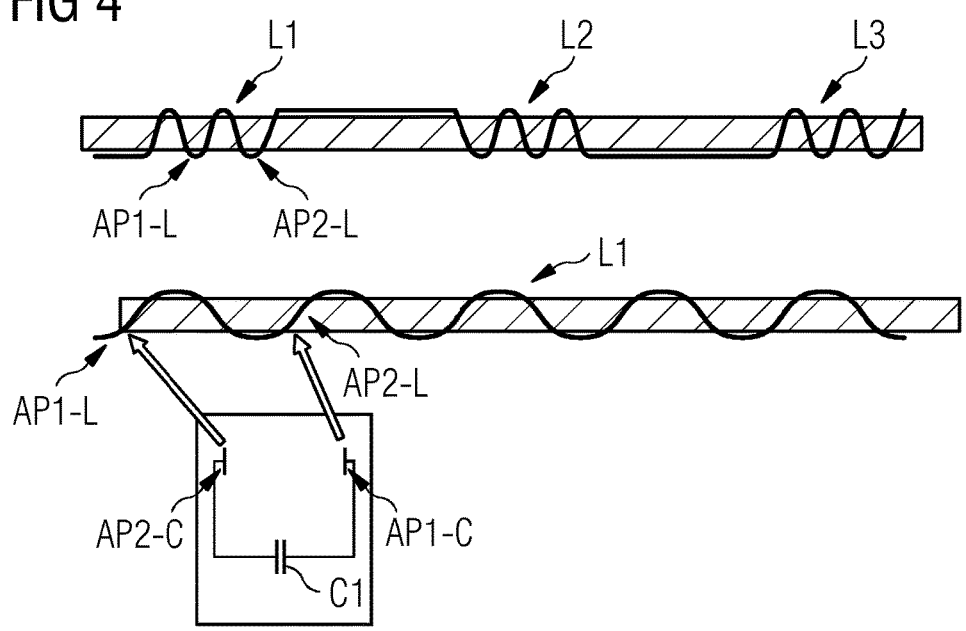
Figure 5:
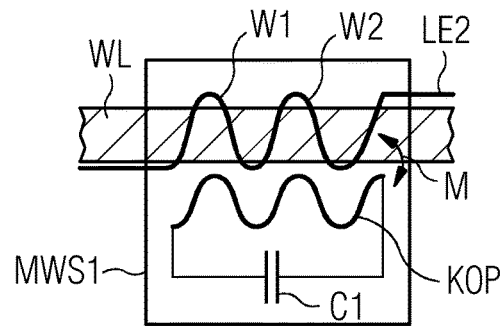
FIG. 5 depicts an example of a simplified sectional diagram of a local coil connection cable with a coil element and a capacitive element inductively coupled into the coil.
Figure 6:
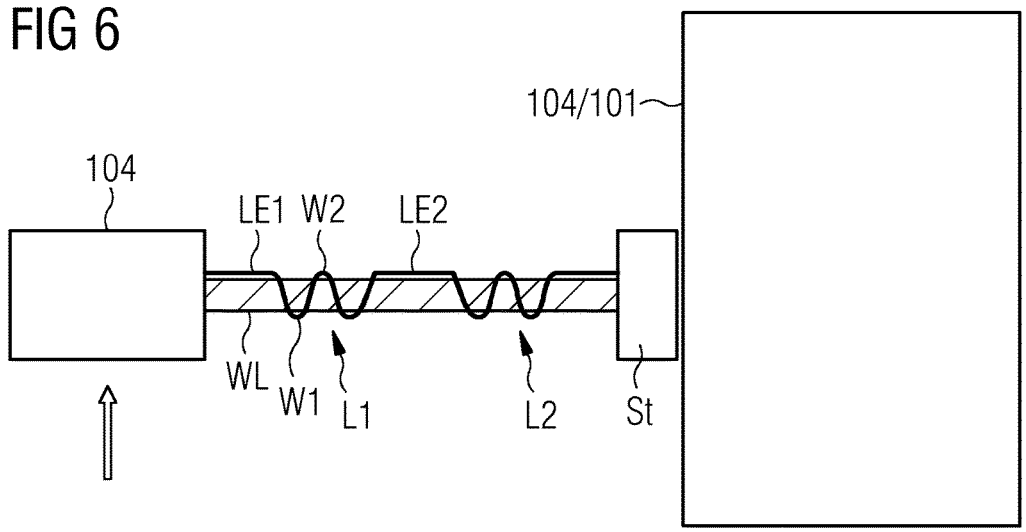
FIG. 6 depicts an example of a simplified diagram of a local coil connection cable with sheath current filters between a local coil and a MRT.

A connection, especially of capacitive elements C1, C2 (with L1 etc.) may be made galvanically, e.g., in accordance with FIG. 4 (e.g., by soldering on and/or pressing on of connection points AP1-C, AP2-C of a capacitive element C1 to connection points AP1-L, AP2-L of an inductive element L1), or in accordance with FIG. 5 inductively (e.g., by a transformer KOP between a capacitive element C1 and an inductive element L1) or capacitively. A printed circuit board PCB, on that a resonant circuit L1, C1 may be mounted in each case, may also be used simultaneously for strain relief for cables K1, K2. Thus a compact design of sheath current filter MWS1, 2, 3 may be produced.

With the use of polymer fibers as waveguide WL the installation may be especially simple, since polymer fibers may be lengthened without further processing of the end faces and may be threaded through the coil elements L1, etc., of the sheath current filter MWS1, etc. This may be somewhat more complex for glass fibers as a waveguide WL since the end face surfaces mostly still have to be polished and/or prepared here.

An advantage may lie in the miniaturization of a sheath current filter, which may be sensible for MRI if in accordance a combination of the signal transmission (local coil to system) with a transmission system based on dielectric conductors (e.g. polymer fibers, glass fibers) is selected. An advantage may lie in the mechanical structure and in the electrical coupling.

FIG. 9 depicts a bazooka sheath current filter. In a bazooka-sheath current filter instead of a coax cable, there may be a waveguide WL/a glass/POV fiber and the bazooka-sheath current filter MWS1 may block sheath currents, e.g., only for one/a number of/all of the remaining signal lines (in FIG. 9 LE1-LE2, LES, LE6).

Unlike the MWS previously described, with a bazooka MWS, instead of a wound inductance, a balun Spr may be used as inductance with (e.g., between outer and inner surface of the multi-layer balun present and/or distributed, etc.) inductance, and/or, e.g., part concentrated capacitance C1, C1a may be provided.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A system comprising:
   an optical, electrically non-conductive waveguide, wherein the optical waveguide is a fiber optical waveguide, and wherein the fiber optical waveguide comprises a sheath; and
   a sheath current filter comprising a coil element, wherein the coil element surrounds the fiber optical waveguide wound around an outer surface of the sheath,
   wherein the sheath current filter is configured to suppress a flow of current on the outer surface of the sheath, and
   wherein a supply current of a local coil runs through or via the sheath current filter.

2. The system as claimed in claim 1, wherein the fiber optical waveguide is a plastic optical waveguide, a polymer fiber optical waveguide, or a combination thereof.

3. The system as claimed in claim 1, wherein the fiber optical waveguide is a glass fiber optical waveguide.

4. The system as claimed in claim 1, wherein the fiber optical waveguide is a waveguide for light.

5. The system as claimed in claim 1, wherein the sheath current filter further comprises a capacitive element.

6. The system as claimed in claim 5, wherein the capacitive element is connected in parallel or in series with the coil element.

7. The system as claimed in claim 5, wherein the capacitive element is inside, outside, or both inside and outside the sheath of the waveguide.

8. The system as claimed in claim 1, further comprising:
a capacitive element connected electrically-conductively to the coil element of the sheath current filter, wherein the capacitive element is soldered or pressed on to the coil element.

9. The system as claimed in claim 1, wherein the coil element comprises at least one electrically-conductive line, wherein the at least one electrically-conductive line is disposed in a spiral-shape, at least in segments, to form the coil element in windings wound around the longitudinal axis of the sheath current filter.

10. The system as claimed in claim 9, wherein the electrically-conductive line comprises copper.

11. The system as claimed in claim 1, wherein the waveguide is configured to transmit signals between the local coil and a magnetic resonance tomography system.

12. The system as claimed in claim 11, wherein the signals are amplified or unamplified signals received by the local coil from a patient or transferred by the magnetic resonance tomography system to the local coil to be transmitted by the local coil.

13. The system as claimed in claim 1, wherein a supply voltage for the local coil is provided at the sheath current filter or at least one electrical line connected to the sheath current filter at one or two ends.

14. The system as claimed in claim 1, wherein the sheath current filter is configured to be mechanically connected to the waveguide by being pushed onto the waveguide, pressed onto the waveguide, integrated into a sleeve of the waveguide, integrated into the sheath of the waveguide, or a combination thereof.

15. The system as claimed in claim 1, wherein the sheath current filter comprises a round or oval cutout for receiving the waveguide, the cutout having a diameter of 0.2 to 3 mm.

16. The system as claimed in claim 1, wherein the sheath current filter is disposed on a printed circuit board comprising a round or oval cutout for receiving the waveguide, the cutout having a diameter of 0.2 to 3 mm.

17. A local coil connection cable comprising:
at least one connector at one or both ends of the local coil connection cable, through which a local coil is connected to an interface on a patient couch, to a magnetic resonance tomography system, or to the interface on the patient couch and to the magnetic resonance tomography system; and
an optical, electrically non-conductive waveguide, wherein the optical waveguide is a fiber optical waveguide, wherein the fiber optical waveguide comprises a sheath, wherein a sheath current filter or a plurality of sheath current filters surround the fiber optical waveguide of the local coil connecting cable, wherein the sheath current filter or the plurality of sheath current filters is configured to suppress a flow of current on an outer surface of the sheath, and wherein a supply current of the local coil runs through or via the sheath current filter.

18. A local coil for a magnetic resonance tomography system, the local coil comprising:
a sheath current filter comprising a coil element; and
a local coil connecting cable comprising an optical, electrically non-conductive waveguide, wherein the optical waveguide is a fiber optical waveguide, wherein the fiber optical waveguide comprises a sheath, and wherein the local coil connecting cable is connected to an interface on a patient couch, to a magnetic resonance tomography system, or to the interface on the patient couch and to the magnetic resonance tomography system,
wherein the sheath current filter surrounds the fiber optical waveguide of the local coil connecting cable,
wherein the sheath current filter is configured to suppress a flow of current on an outer surface of the sheath, and
wherein a supply current of the local coil runs through or via the sheath current filter.

19. The local coil as claimed in claim 18, further comprising:
an electro-optical converter connected to at least one antenna of the local coil with or without intermediate amplifier or a filter, to which the waveguide is connected electrically non-conductively,
wherein the sheath current filter is connected electrically-conductively to the local coil.

20. A method for manufacturing a sheath current filter or a local coil connection cable for a magnetic resonance tomography device, the method comprising:
forming a coil element with at least one electrically conductive line by either plugging in a printed circuit board or by winding on;
disposing the coil element around an optical, electrically non-conductive waveguide, wherein the optical waveguide is a fiber optical waveguide, wherein the coil element is wound around an outer surface of a sheath of the fiber optical waveguide; and
connecting the coil element with a capacitive element,
wherein the sheath current filter is configured to suppress a flow of current on the outer surface of the sheath, and
wherein a supply current of a local coil is configured to run through or via the coil element.

* * * * *